United States Patent
Wouters et al.

(10) Patent No.: US 9,484,389 B2
(45) Date of Patent: Nov. 1, 2016

(54) THREE-DIMENSIONAL RESISTIVE MEMORY ARRAY

(71) Applicant: IMEC, Leuven (BE)

(72) Inventors: Dirk Wouters, Leuven (BE); Gouri Sankar Kar, Leuven (BE)

(73) Assignee: IMEC, Leuven (BE)

( * ) Notice: Subject to any disclaimer, the term of this patent is extended or adjusted under 35 U.S.C. 154(b) by 45 days.

(21) Appl. No.: 14/577,937

(22) Filed: Dec. 19, 2014

(65) Prior Publication Data

US 2015/0179705 A1    Jun. 25, 2015

(30) Foreign Application Priority Data

Dec. 20, 2013  (EP) ..................................... 13198989
Jan. 8, 2014   (EP) ..................................... 14150456

(51) Int. Cl.
*H01L 27/24*    (2006.01)
*H01L 45/00*    (2006.01)

(52) U.S. Cl.
CPC ......... *H01L 27/2436* (2013.01); *H01L 27/249* (2013.01); *H01L 27/2481* (2013.01); *H01L 45/1233* (2013.01); *H01L 45/145* (2013.01); *H01L 45/1608* (2013.01); *H01L 45/1675* (2013.01); *H01L 45/1683* (2013.01); *H01L 45/04* (2013.01); *H01L 45/1226* (2013.01); *H01L 45/146* (2013.01); *H01L 45/1616* (2013.01)

(58) Field of Classification Search
None
See application file for complete search history.

(56) References Cited

U.S. PATENT DOCUMENTS

| | | | |
|---|---|---|---|
| 7,800,091 B2 | 9/2010 | Kamigaichi et al. | |
| 7,910,914 B2 | 3/2011 | Tanaka et al. | |
| 8,063,438 B2 | 11/2011 | Son et al. | |
| 8,187,932 B2 | 5/2012 | Nguyen et al. | |
| 8,299,571 B2 | 10/2012 | Ozawa et al. | |
| 8,309,417 B2 | 11/2012 | Son et al. | |
| 8,338,244 B2 | 12/2012 | Son et al. | |
| 8,344,346 B2 | 1/2013 | Baek et al. | |
| 8,344,385 B2 | 1/2013 | Kim et al. | |
| 8,372,732 B2 | 2/2013 | Kim | |
| 8,395,139 B1 | 3/2013 | Ho et al. | |
| 2009/0230458 A1 | 9/2009 | Ishiduki et al. | |
| 2010/0219392 A1 | 9/2010 | Awaya et al. | |
| 2010/0237312 A1 | 9/2010 | Seol et al. | |
| 2011/0147823 A1* | 6/2011 | Kuk .................. | H01L 27/11551 257/324 |
| 2011/0149656 A1 | 6/2011 | Tang et al. | |
| 2011/0199813 A1 | 8/2011 | Yoo et al. | |
| 2011/0210301 A1 | 9/2011 | Nansei | |
| 2011/0309322 A1* | 12/2011 | Hwang .............. | G11C 13/0007 257/5 |
| 2011/0316063 A1 | 12/2011 | Tang et al. | |
| 2012/0068242 A1 | 3/2012 | Shin et al. | |
| 2012/0104351 A1 | 5/2012 | Wei et al. | |

(Continued)

OTHER PUBLICATIONS

Extended European Search Report dated Jun. 5, 2014 for European Patent Application No. EP 14150456.3.

*Primary Examiner* — Mary Wilczewski
*Assistant Examiner* — Erik T Peterson
(74) *Attorney, Agent, or Firm* — Knobbe Martens Olson & Bear LLP (57) ABSTRACT

A method for manufacturing a three-dimensional resistive memory array is disclosed. The method comprises forming a repetitive sequence comprising an isolating layer, a semiconductor layer, a gate insulating layer, and a conductive layer. By performing a plurality of processing steps on the repetitive sequence a three-dimensional resistive memory array is obtained. A three-dimensional resistive memory array is further disclosed.

7 Claims, 10 Drawing Sheets

(56) References Cited

U.S. PATENT DOCUMENTS

| | | |
|---|---|---|
| 2012/0161094 A1 | 6/2012 | Huo et al. |
| 2012/0187363 A1 | 7/2012 | Liu et al. |
| 2012/0248504 A1 | 10/2012 | Liu |
| 2012/0286226 A1 | 11/2012 | Seong et al. |
| 2012/0305877 A1 | 12/2012 | Ju et al. |
| 2013/0016555 A1 | 1/2013 | Kim et al. |
| 2013/0034945 A1 | 2/2013 | Park |
| 2013/0056820 A1 | 3/2013 | Jeong |
| 2013/0065381 A1 | 3/2013 | Son et al. |
| 2013/0153847 A1 | 6/2013 | Park et al. |
| 2013/0248801 A1* | 9/2013 | Yamamoto ............ H01L 27/249 257/4 |
| 2013/0306933 A1 | 11/2013 | Liu et al. |
| 2014/0061574 A1* | 3/2014 | Pio ..................... H01L 27/10 257/5 |

\* cited by examiner

THREE-DIMENSIONAL RESISTIVE MEMORY ARRAY

BACKGROUND

1. Technological Field

The present disclosure relates to a three-dimensional resistive memory array and a method for forming the same.

2. Description of the Related Technology

There is a continuous need for increasing bit density and reducing bit cost in memory devices, and new alternatives are being proposed for ultra-high density memory technologies, such as, three-dimensional stacked resistive random-access memory (3D RRAM) devices.

One possibility for advanced scaling of RRAM device in 3D consists of vertically stacking of horizontal planes, the horizontal planes each comprising a memory array with 1 selector and 1 RRAM cell. This is however a more pseudo-3D approach for which the manufacturing process is too costly. Another possibility is the so-called 3D RRAM BICS approach as for example disclosed in U.S. Pat. No. 8,063,438. A vertical-type RRAM device is disclosed including an insulation layer pattern of a linear shape provided on a substrate and pillar-shaped single-crystalline semiconductor patterns provided on both sidewalls of the insulation layer pattern and transistors provided, also in the vertical direction, on a sidewall of each of the single-crystalline semiconductor patterns.

There is a need for alternative solutions to manufacture 3D RRAM devices which comprise a resistor and a selector, preferably a transistor (1T1R) in the cell.

SUMMARY OF CERTAIN INVENTIVE ASPECTS

An object of the present disclosure is to provide an improved method for manufacturing a three-dimensional resistive memory (3D RRAM) array comprising a transistor selector in each cell (i.e. 1T1R cell). A further object is to provide an improved three-dimensional resistive memory array.

According to a first aspect of the present disclosure, a method for manufacturing a three-dimensional 1T-1R resistive memory array is provided. The method comprises the steps of a) providing a substrate, b) forming a stack of layers arranged on top of each other on a front surface of the substrate, wherein the stack of layers comprises a repetitive sequence, each sequence comprising an isolating layer, a semiconductor layer, a gate insulating layer, and a conductive layer, wherein the gate insulating layer is arranged between the semiconductor layer and the conductive layer, c) forming a plurality of parallel trenches through the stack of layers, the trenches being alternating of a first type and a second type and extending along and to the front surface of the substrate, d) removing at least a portion of the conductive layer in each sequence of the stack of layers from inner side walls of the first type and the second type of trenches such that recesses are formed in each sequence of the stack of layers, e) filling the trenches of the first type and the second type, and the recesses with a first type of dielectric material, f) removing the first type of dielectric material formed in the first type of trenches thereby exposing the side walls of the trenches of the first type, g) forming a metal oxide layer on the exposed inner side walls of the trenches of the first type, wherein the metal oxide layer is partly filling the first type of trenches, h) forming a first type of conductive material in a remaining portion of the trenches of the first type, i) removing the first type of dielectric material formed in the second type of trenches, j) forming a second type of conductive material in the trenches of the second type, k) forming in each trench of the first type a plurality of separated holes extending through the stack of layers, and exposing the metal oxide layer formed on the inner side walls of the trenches of the first type, l) forming in each trench of the second type a plurality of separated holes extending through the stack of layers, and m) filling the plurality of separated holes formed in the trenches of the first type and the second type with a second type of dielectric material.

It is an advantage of the method of the present disclosure that a cost-effective fabrication flow may be used for manufacturing a three-dimensional resistive memory array with a 1T1R cell. The manufacturing of the three-dimensional 1T1R resistive memory array may further be performed using conventional processing steps, which reduces cost associated with the fabrication. Furthermore, the method is not dependent on stacking of prefabricated memory cells (so-called pseudo-3D) in order to achieve a three-dimensional memory array.

The method may further comprise removing the exposed metal oxide formed on the inner side walls of the trenches of the first type, such that the semiconductor layer is at least partly exposed, and at least partly removing the exposed semiconductor layer.

A more efficient resistive memory array may thereby be provided by the method as parasitic conduction resulting in undesired parasitic currents may be reduced by partly removing the exposed semiconductor layer. Further, the method allows improved device performance and facilitates high density packing of the three-dimensional memory arrays.

The isolating layer may comprise an oxide or a nitride, the semiconductor layer may comprise Si, Ge or a III-V material, the gate insulating layer may comprise $SiO_2$ or a dielectric material and the conductive layer may comprise TiN, TaN, W or doped or undoped polySi. By using conventional materials, efficient manufacturing processes or protocols may be used to, for example, deposit and etch the materials of the three-dimensional memory array.

The method may further comprise the step of providing an additional oxide layer on top of the stack of layers. The additional layer, such as additional layer 117, improves the electrical isolation and protects the stack of layers at the top of the three-dimensional resistive memory array.

The first and/or second type of dielectric material may comprise silicon oxide or silicon nitride, which facilitates efficient manufacturing of the resistive memory arrays.

The metal oxide layer may comprise a binary oxide from transition metals. These materials are suitable for usages as resistive switching elements, i.e. as the active layer or memory cell of a memory device. The memory cell may thereby be formed in the metal oxide layer.

The first and/or second type of conductive material may comprise a material selected from the group consisting of, semiconductors, metals, conductive oxides, metal nitrides and metal silicides.

According to a second aspect of the present disclosure, a three-dimensional resistive memory array is provided. The three-dimensional resistive memory array comprises an elongated stack of a repetitive sequence, each sequence comprising an isolating layer, a semiconductor layer, a gate insulating layer, and a conductive layer, the layers being stacked in a perpendicular direction with respect to a longitudinal direction of the elongated stack, wherein the gate insulating layer is arranged between the semiconductor layer and the conductive layer, wherein the semiconductor layer, the gate insulating layer, and the conductive layer forms an array of selector transistors arranged along the longitudinal direction of the elongated stack, the elongated stack having a first side surface extending along and to the longitudinal direction of the elongated stack, and a second side surface being opposite to the first side surface, wherein the first side surface of the elongated stack is provided with a metal oxide layer, the metal oxide layer being provided with, on a surface facing away from the elongated stack, a second type of dielectric material and a first type of conductive material, the second dielectric material and the first type of conductive material alternating along the longitudinal direction of the elongated stack, wherein the second side surface of the elongated stack is provided with the second type of dielectric material and a second type of conductive material, the second type of dielectric material and the second type of conductive material alternating along the longitudinal direction of the elongated stack.

The conductive layer in each sequence of the repetitive sequence may be provided with a first isolation portion arranged adjacent to the first side surface of the elongated stack and/or a second isolation portion arranged adjacent to the second side surface of the elongated stack. This is advantageous as a structure may be obtained in which the conductive layer is electrically isolated from the metal oxide layer in the trenches of the first type and/or the second type of conductive material in the trenches of the second type. In addition, leakage currents from the conductive materials to the metal oxide layer may be mitigated. An improved three-dimensional resistive memory array may thereby be obtained.

The metal oxide layer may be provided at locations corresponding to the first type of conductive material alternating along the longitudinal direction of the elongated stack, and the semiconductor layer may be thinner at locations corresponding to the second type of dielectric material alternating along the longitudinal direction of the elongated stack. Parasitic conduction paths may thereby be mitigated such that an improved three-dimensional resistive memory array is obtained.

The selector transistors may be junction less pinch off field effect transistors. This may allow for efficient control of charge carriers in the transistor such that a current flowing through transistor may easily be controlled.

The three-dimensional resistive memory array may comprise an additional elongated stack of a repetitive sequence, wherein the first side surface of the elongated stack and the first side surface of the additional elongated stack are facing each other.

Further features of, and advantages with, the present disclosure will become apparent when studying the appended claims and the following description. The skilled person will realize that different features of the present disclosure may be combined to create embodiments other than those described in the following, without departing from the scope of the present disclosure.

BRIEF DESCRIPTION OF THE DRAWINGS

This and other aspects of the present disclosure will now be described in more detail, with reference to the enclosed drawings showing embodiments of the disclosure.

DETAILED DESCRIPTION OF CERTAIN ILLUSTRATIVE EMBODIMENTS

The present disclosure will now be described more fully hereinafter with reference to the accompanying drawings, in which certain embodiments of the disclosure are shown. This disclosure may, however, be embodied in many different forms and should not be construed as limited to the embodiments set forth herein. These embodiments are rather provided for thoroughness and completeness, and for fully conveying the scope of the disclosure to the skilled person.

Figure 7:
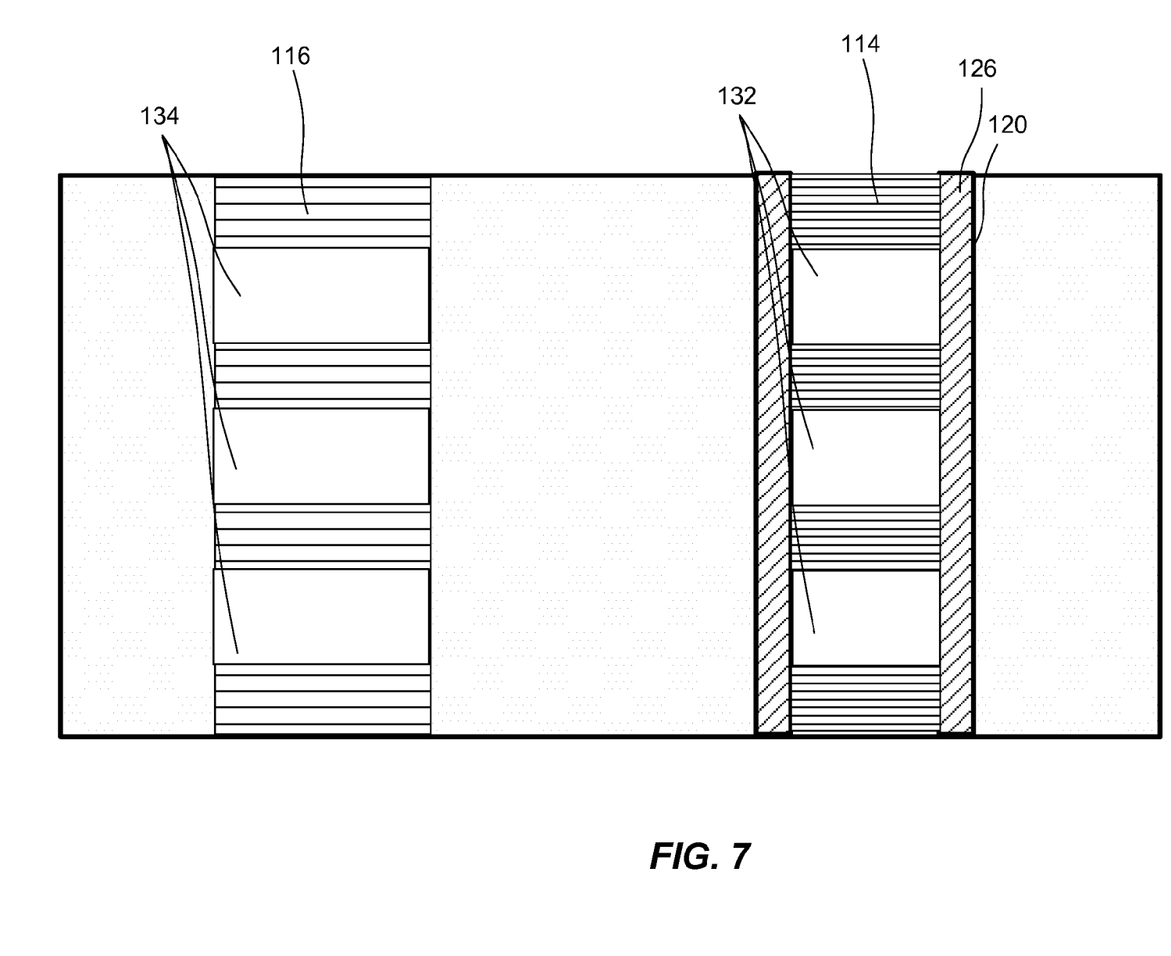
FIG. 7 illustrates a top view of a preliminary stage of a three-dimensional resistive memory array according to an embodiment of the present disclosure.
Figure 8:
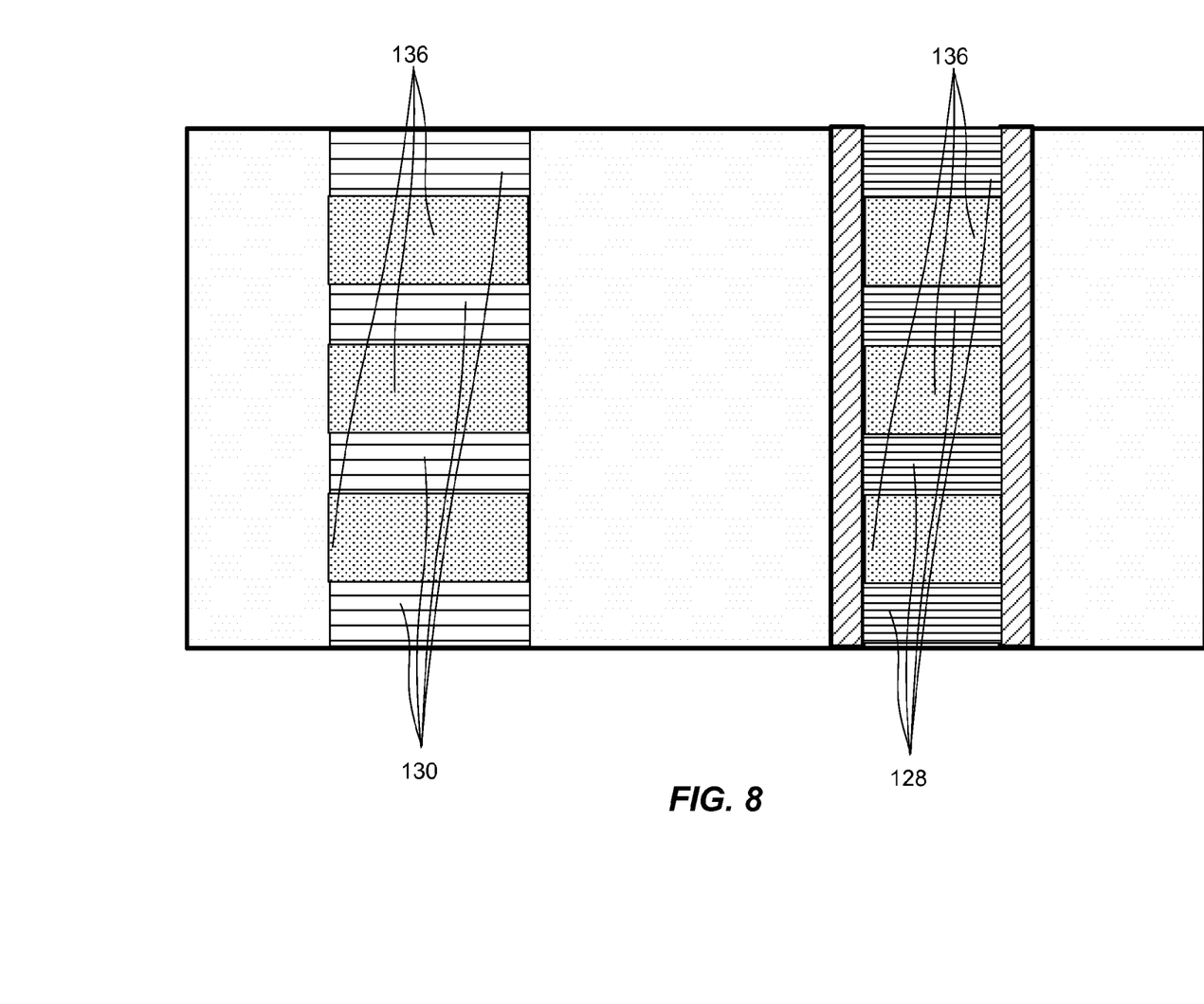
FIG. 8 illustrates a top view of a three-dimensional resistive memory array according to an embodiment of the present disclosure.
Figure 9:
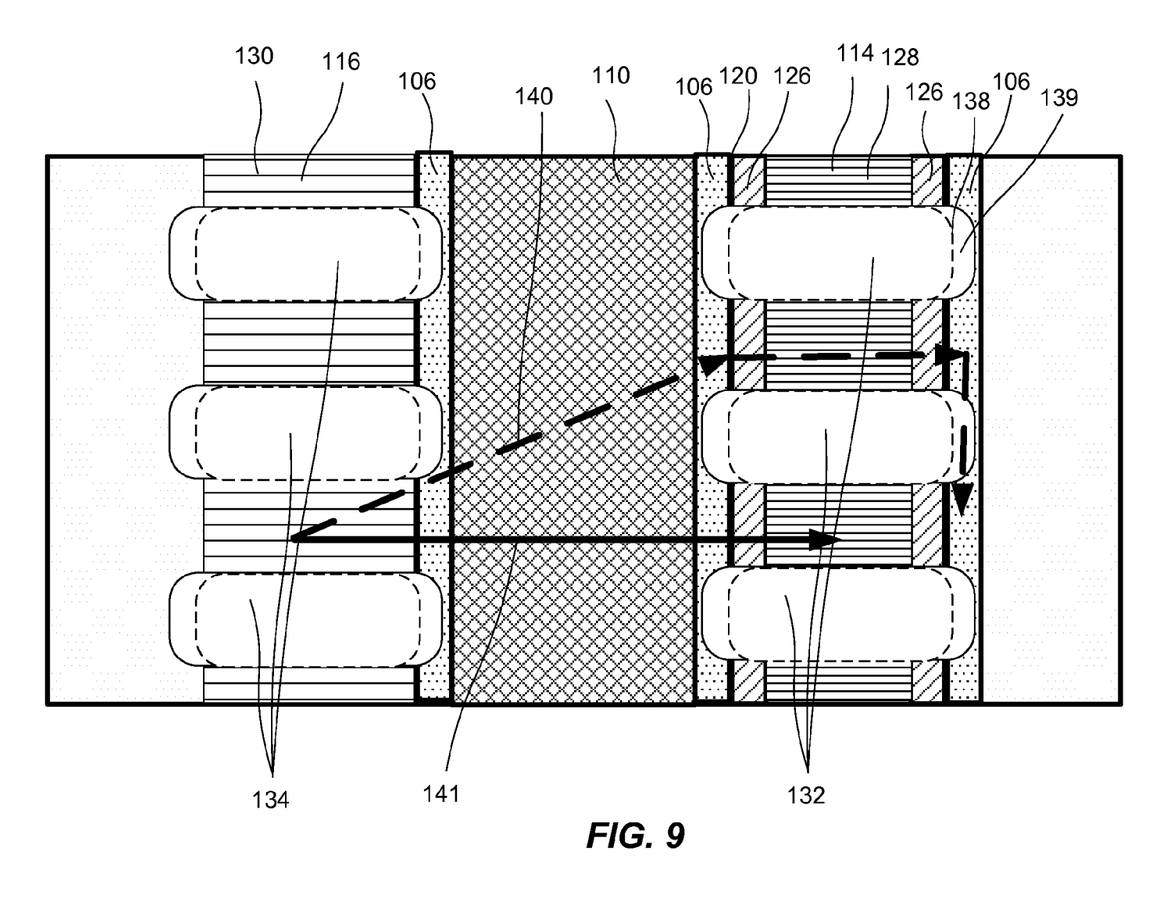
FIG. 9 illustrates a top view of a preliminary stage of a three-dimensional resistive memory array according to an embodiment of the present disclosure.
Figure 10:
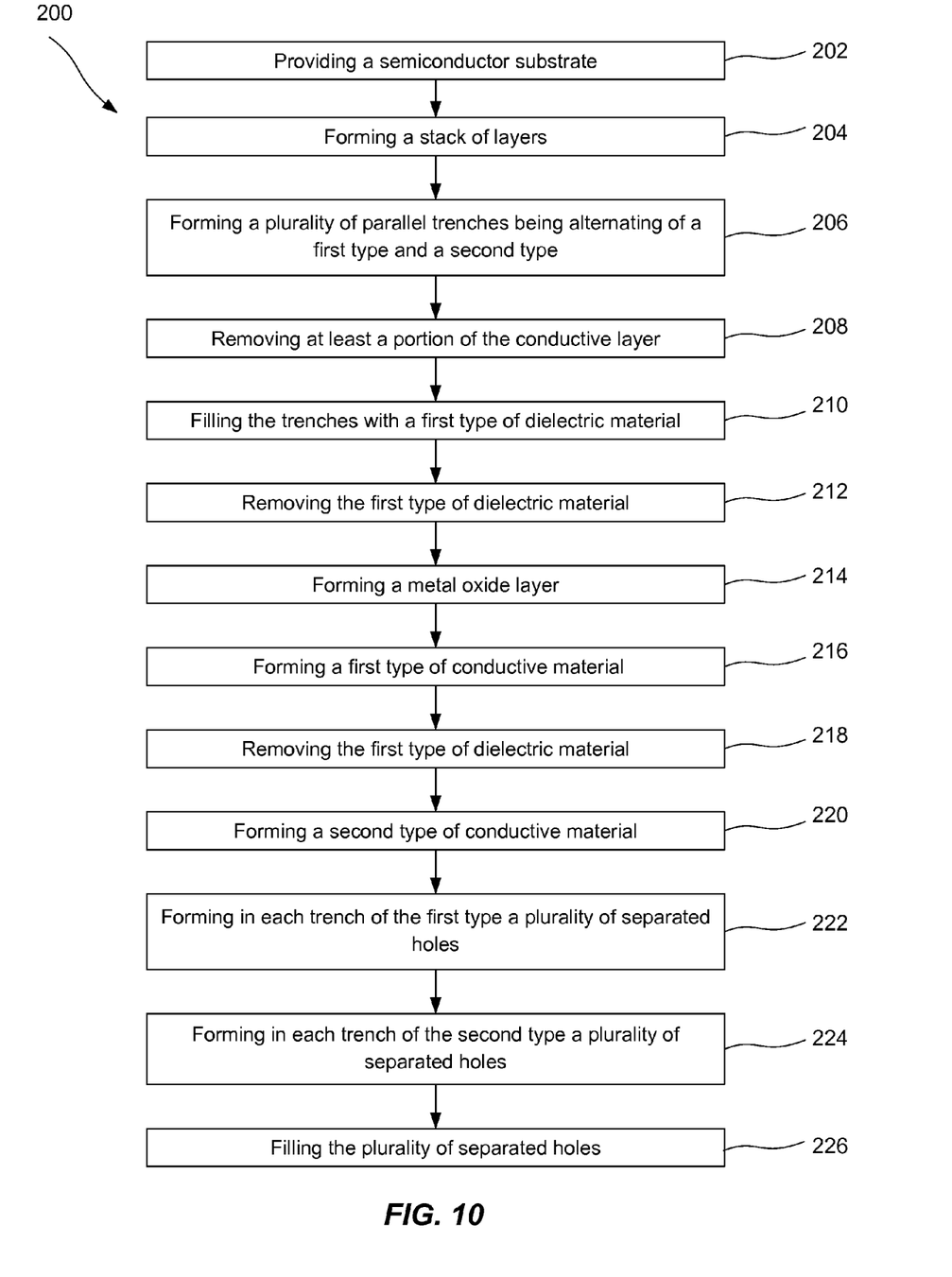
FIG. 10 illustrates a flowchart of a method according to an embodiment of the present disclosure.

A method for manufacturing a three-dimensional resistive memory array in accordance with the present disclosure will now be described with reference to FIGS. 1 to 9 which illustrate a plurality of manufacturing steps in more detail. FIGS. 1 to 6 shows front views of preliminary stages of the three-dimensional resistive memory array, whereas FIGS. 7 to 9 provides top views of the same memory array. FIG. 8 illustrates top view of a final stage of the three-dimensional memory arrays according to one embodiment of the present disclosure. The flowchart in FIG. 10 illustrates a method 200 comprising a plurality of manufacturing steps for a three-dimensional resistive memory array in accordance with the present disclosure.

Figure 1:
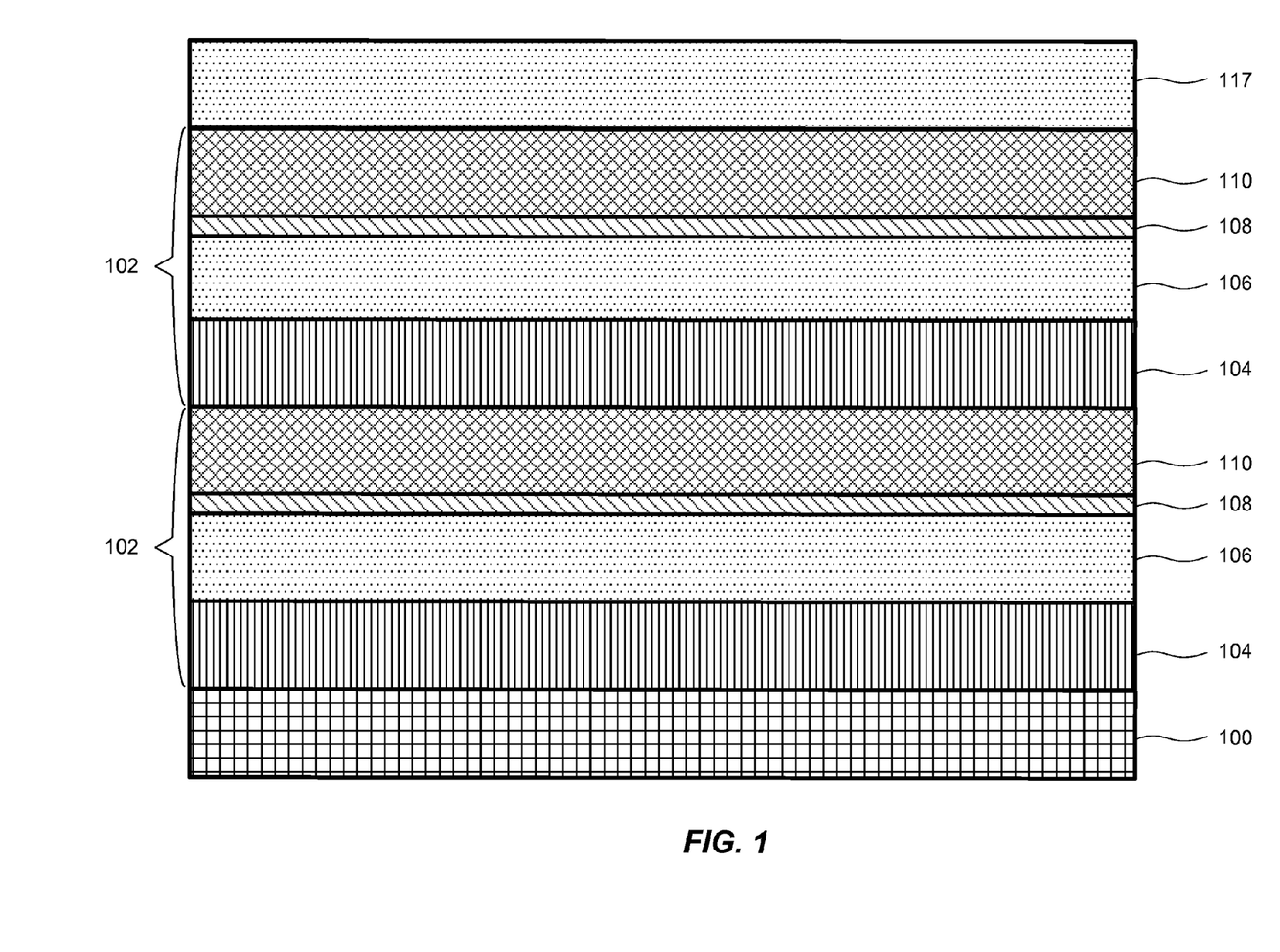
FIG. 1 illustrates a front view of a preliminary stage of a three-dimensional resistive memory array according to an embodiment of the present disclosure.

FIG. 1 illustrates a front view of a preliminary stage of a three-dimensional resistive memory array according an embodiment of the present disclosure. At the bottom of the layer structure shown in FIG. 1, a substrate 100 has been provided according to step 202 of the method 200. In embodiments of the present disclosure, the term substrate may include any underlying material or materials that may be used, or upon which a device according to embodiments of the present disclosure may be formed. In particular embodiments, this substrate may include a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. The substrate may further include, for example, an insulating layer such as a $SiO_2$ or a $Si_3N_4$ layer in addition to a semiconductor substrate portion. Thus, the term substrate also includes silicon-on-glass, silicon-on sapphire substrates. The term substrate is thus used to define generally the elements of layers that underlie a layer or portions of interest. Also, the substrate may be any other base on which a layer is formed, for example a glass or metal layer. As examples, the substrate may be made of any suitable material, the material of the substrate may be amorphous, polycrystalline or crystalline.

On top of the front surface of the substrate 100, two stacks of layers 102 are shown. Each stack of layers 102 comprises a repetitive sequence comprising an isolating layer 104, a semiconductor layer 106, a gate insulating layer 108 and a conductive layer 110. The stacks of layers 102 are provided in the step 204 of the method 200. As can be seen in FIG. 1 the gate insulating layer 108 is arranged between the semiconductor layer 106 and the conductive layer 110. In FIG. 1 two stacks of layers 102 are illustrated for clarity although a person skilled in the art understands that any number of stacks of layers 102 may be arranged on top of each other in order to form the three-dimensional resistive memory array. An additional oxide layer 117 is further arranged on top of the stacks of layers 102.

The layers in the stack of layers 102 may comprise conventional materials used in the semiconductor industry. The isolating layer 104 may comprise an oxide such as for example SiO or a nitride such as for example SiN. The semiconductor layer 106 may comprise a semiconductor material such as for example Si, Ge or a III-V material. The gate insulating 108 layer may comprise $SiO_2$ or a dielectric material. The conductive layer 110 may comprise any material suitable for a gate electrode such as for example doped or undoped poly-Si, or a metal such as for example TiN, TaN, W. By using conventional materials a three-dimensional resistive memory array may be provided in a cost efficient way.

The stack of layers 102 may be formed using standard deposition techniques known to a person skilled in the art, such as, for example, chemical vapour phase deposition (CVD), more preferably, low pressure CVD (LPCVD) or similar techniques.

It should be noted that the additional layer 117 is provided optional in order to improve the electrical isolation and to protect the stack of layers 102 at the top of the three-dimensional resistive memory array. According to other embodiments the three-dimensional resistive memory array may be provided without the additional oxide layer 117.

Figure 2:
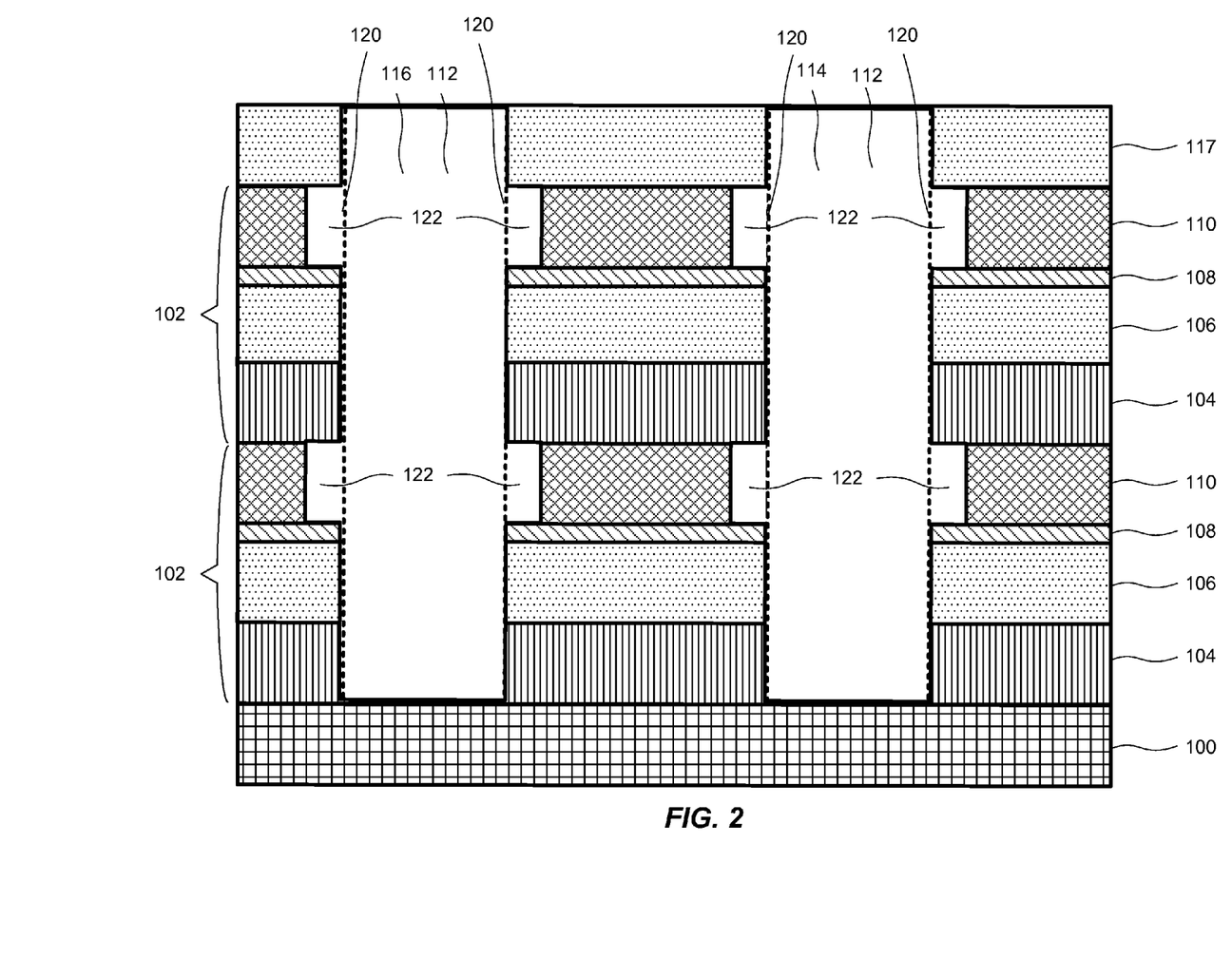
FIG. 2 illustrates a front view of a preliminary stage of a three-dimensional resistive memory array according to an embodiment of the present disclosure.

FIG. 2 illustrates a preliminary stage of the three-dimensional resistive memory array disclosed in FIG. 1, but after the stacks of layers 102 have been processed further. The processing has involved additional processing steps which will be described in the following. In one step a plurality of parallel trenches 112 has been formed. The first step relates to step 206 of the method 200. The trenches 112 are extending through the stack of layers 102 to the front surface of the substrate 100. The trenches 112 have smooth vertical inner sidewalls 120 which for clarity are illustrated with dashed lines 120. The obtained trenches 112 are, in other words, elongated trenches or channels which extend in a parallel manner along the front side of the substrate 100. In the following, the trenches 112 will be described as being of a first type 114 and a second type 116. For clarity only one of each type of trenches 112 are illustrated in FIG. 2. It should be noted that the three-dimensional resistive memory array may comprise any number of trenches 112 that are alternating of a first type 114 and a second type 116.

The formation 206 of the plurality of trenches 112 may be achieved using standard process techniques known to a person skilled in the art. The standard process techniques may include, for example, lithographic steps comprising forming a hard mask layer of e.g. metal on the additional oxide layer 117 and a photoresist layer on top of the hard mask layer. The hard mask may then subsequently be patterned. When patterning the hard mask layer a common approach is to expose and develop the photoresist such that selected portions of the hard mask are exposed. The exposed portions of the hardmask may then be removed by e.g. etching, using the photoresist as an etch mask. In the following the plurality of trenches 112 may be formed in the stack of layers by etching through the stack of layers 102, using the hard mask layer as an etch mask. The hard mask layer may then be removed using conventional methods.

Another step performed in order to obtain the preliminary stage of the three-dimensional resistive memory array shown in FIG. 2 will now be described. This step comprises removing at least a portion of the conductive layer 110 in each sequence of the stack of layers 102 from inner side walls 120 of the first type 114 and the second type 116 of trenches 112 such that recesses 122 are formed in each sequence of the stack of layers 102. The process step corresponds to the step 208 of the method 200.

The etching is preferably performed using an anisotropic etch process resulting in that mainly the conductive layer 110 is etched whereby the recesses 122 are formed. In other words, as a result of anisotropic etching in the second process step, recesses 122 are formed in the previously smooth vertical inner side walls 120 of the trenches 112.

Figure 3:
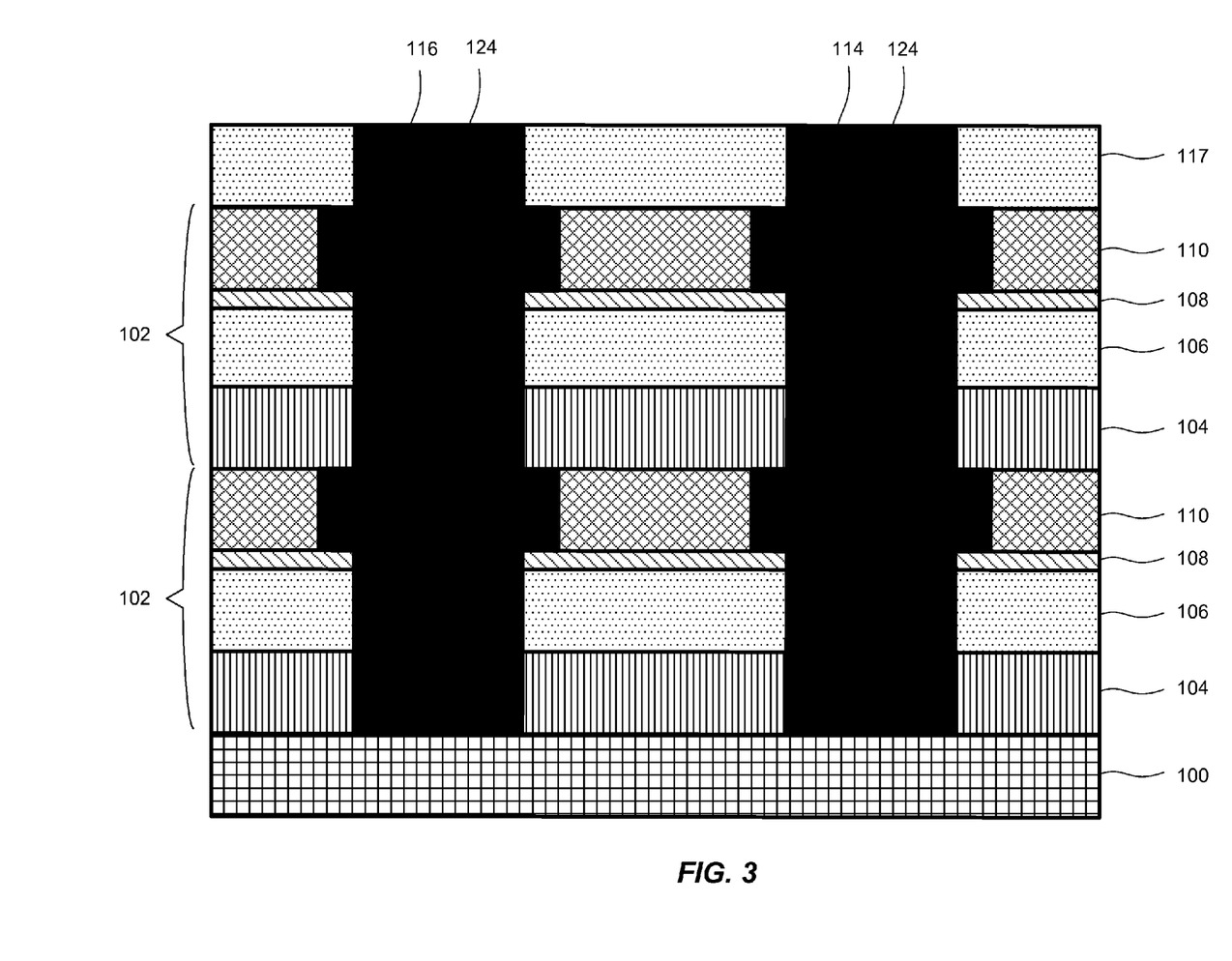
FIG. 3 illustrates a front view of a preliminary stage of a three-dimensional resistive memory array according to an embodiment of the present disclosure.

FIG. 3 illustrates the preliminary stage of the three-dimensional resistive memory array, disclosed in FIGS. 1 and 2, but after the trenches (and the recesses) of the first type 114 and the trenches (and the recesses) of the second type 116 have been filled with a first type of dielectric material 124. This filling corresponds to step 210 of the method 200. As illustrated in FIG. 3, the recesses 122 are also filled with a first type of dielectric material 124.

The first dielectric material 124 may comprises for example silicon oxide or silicon nitride which are standard materials used in the semiconductor industry. These materials are easy to handle and the filling of the trenches may be performed following standard recipes using standard processes.

Figure 4:
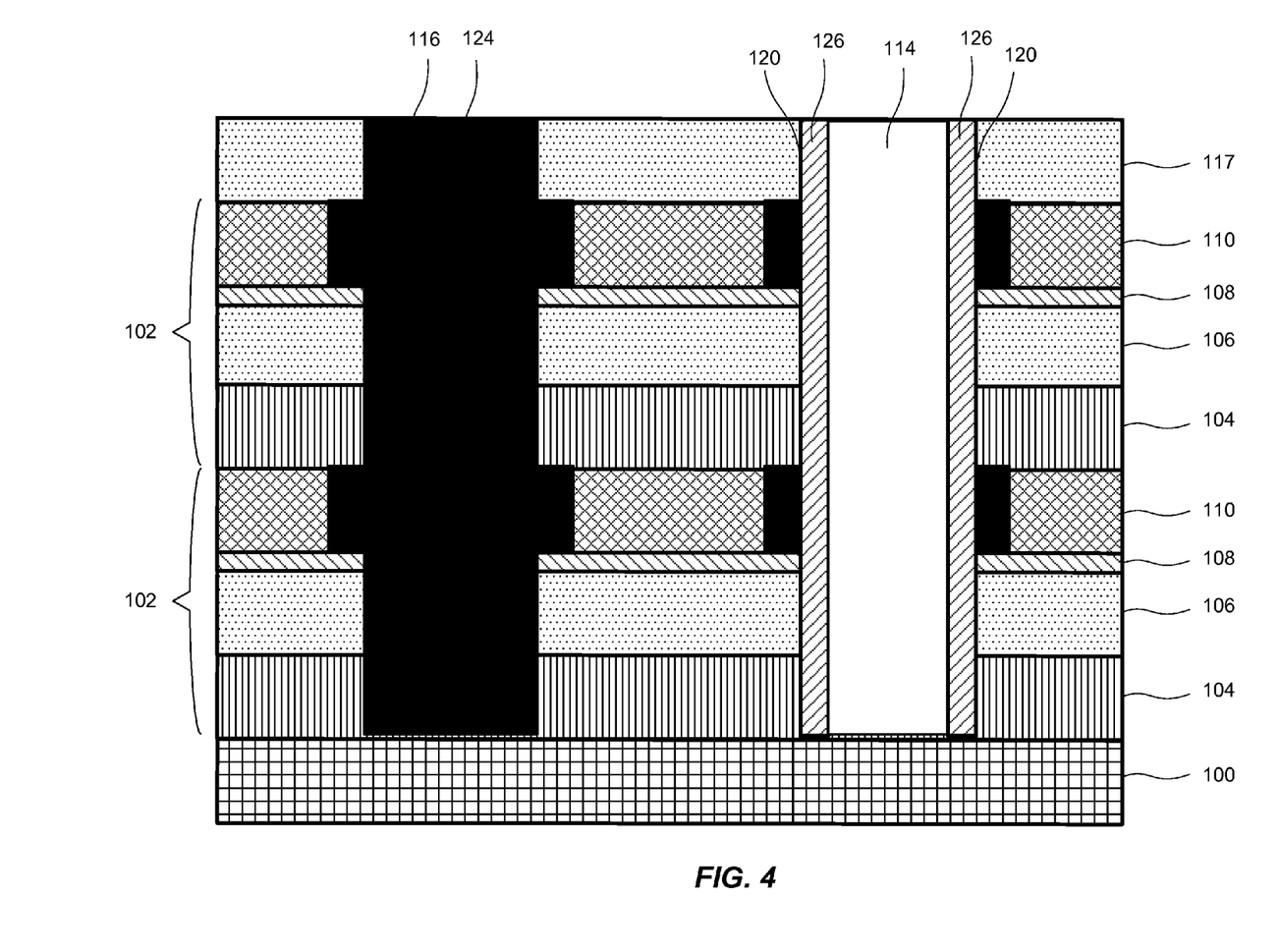
FIG. 4 illustrates a front view of a preliminary stage of a three-dimensional resistive memory array according to an embodiment of the present disclosure.

FIG. 4 illustrates the preliminary stage of the three-dimensional resistive memory array, disclosed in FIGS. 1 to 3, after additional processing of the stack of layers 102 has been performed. The processes correspond to the steps 212 and 214 of the method 200 of FIG. 10. In one step the first type of dielectric material 124 in the first type of trenches 114 has been removed such that the side walls 120 of the trenches of the first type 114 are exposed. The first dielectric material 124 which is present in the recesses is not removed. For removing the first dielectric material 124 in the first type of trenches 114 preferably a directional etching step is used.

In a following step a metal oxide layer 126 has been formed on the exposed inner side walls 120 of the trenches of the first type 114. As illustrated in FIG. 4, the metal oxide layer 126 is only partly filling the first type of trenches 114. In other words, a void space is present between the metal oxide layers 126 formed on the respective inner side walls 120 of the trenches of the first type 114. The metal oxide layer 126 is preferably deposited conformal along the trench. This may be done for example using atomic layer deposition (ALD). The metal oxide layer 126 is not deposited on the front surface of the substrate 100.

The metal oxide layer 126 comprises a binary oxide from transition metals such as for example NiO, HfO, TaO, ZrO, AlO, NbO, TiO, . . . By providing a binary oxide layer as an active layer or memory cell in a three-dimensional resistive memory array, efficient switching of the resistance of the memory cell may be performed. In other words, it is possible to switch the metal oxide layer between a high resistance state and a low resistance state which may be used for example to switch a RRAM back and forth between different memory states. In one embodiment, the metal oxide layer 126 may comprise hafnium oxide which is known to show good switching characteristics, which is vital for using the metal oxide layer 126 as an active layer, also called memory cell, in non-volatile memory applications. Hafnium oxide is furthermore advantageous to use as it is a high-k dielectric.

Figure 5:
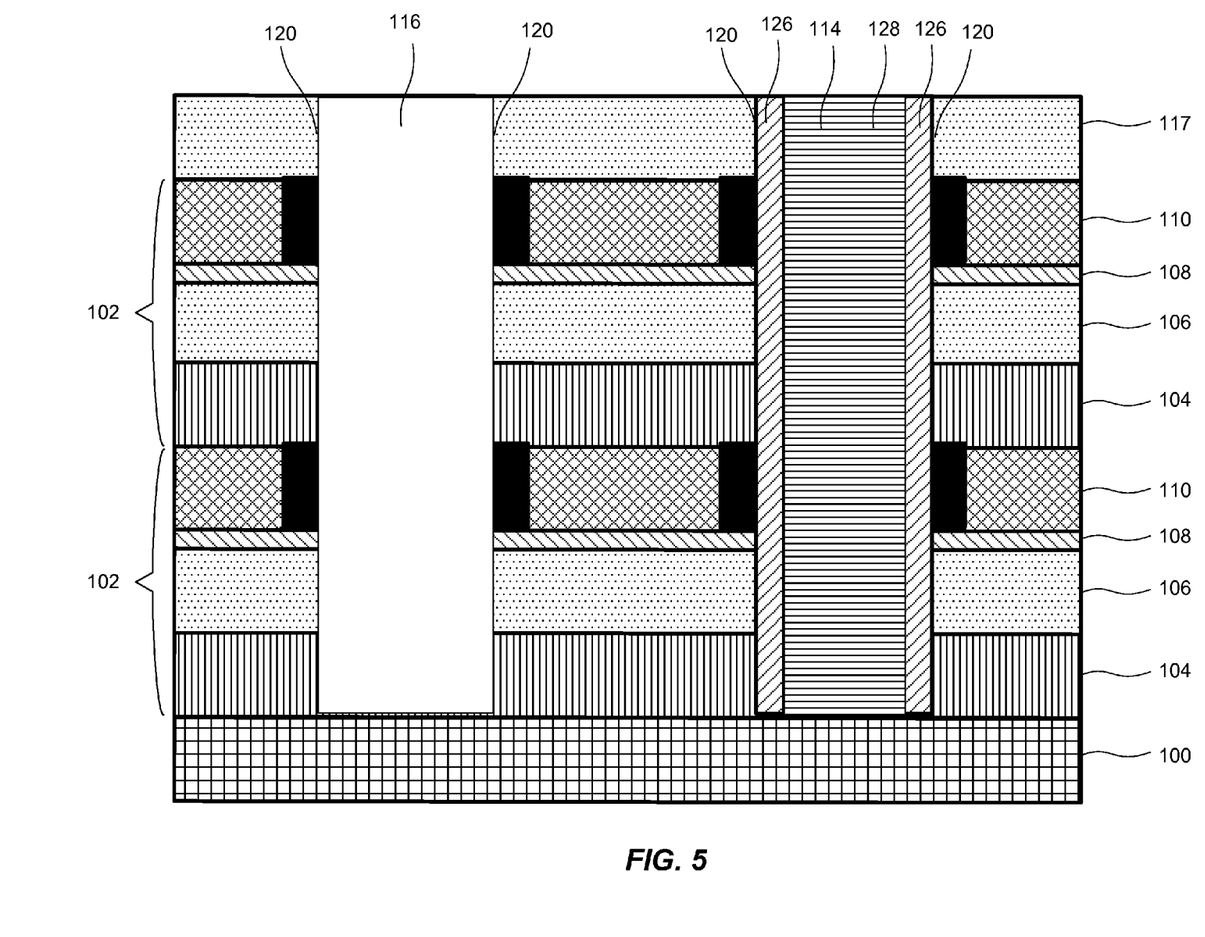
FIG. 5 illustrates a front view of a preliminary stage of a three-dimensional resistive memory array according to an embodiment of the present disclosure.

FIG. 5 illustrates the preliminary stage of the three-dimensional resistive memory array disclosed in FIGS. 1 to 4, after additional processing steps have been made. The steps correspond to the step 216 and 218 of the method 200, respectively.

Firstly, a first type of conductive material 128 has been formed in the remaining portion or void space of the trenches of the first type 114. The first type of conductive material 128 may comprise semiconductors, metals, conductive oxides, metal nitrides and metal silicides. Hence, it is possible to use standard materials commonly used in the semiconductor industry. In addition to that it is also possible to tailor the electric properties of the first type of conductive material 128 such that an efficient operation and desirable conducting properties of the conductive material 128 are obtained. This first type of conductive material 128 will function as a top electrode for the RRAM switching element.

Secondly, the first type of dielectric material 124 formed in the second type of trenches 116 has been removed such that the side walls 120 of the trenches of the second type 116 are exposed. The first dielectric material 124 which is present in the recesses is not removed. For removing the first dielectric material 124 in the second type of trenches 116 preferably a directional etching step is used.

Figure 6:
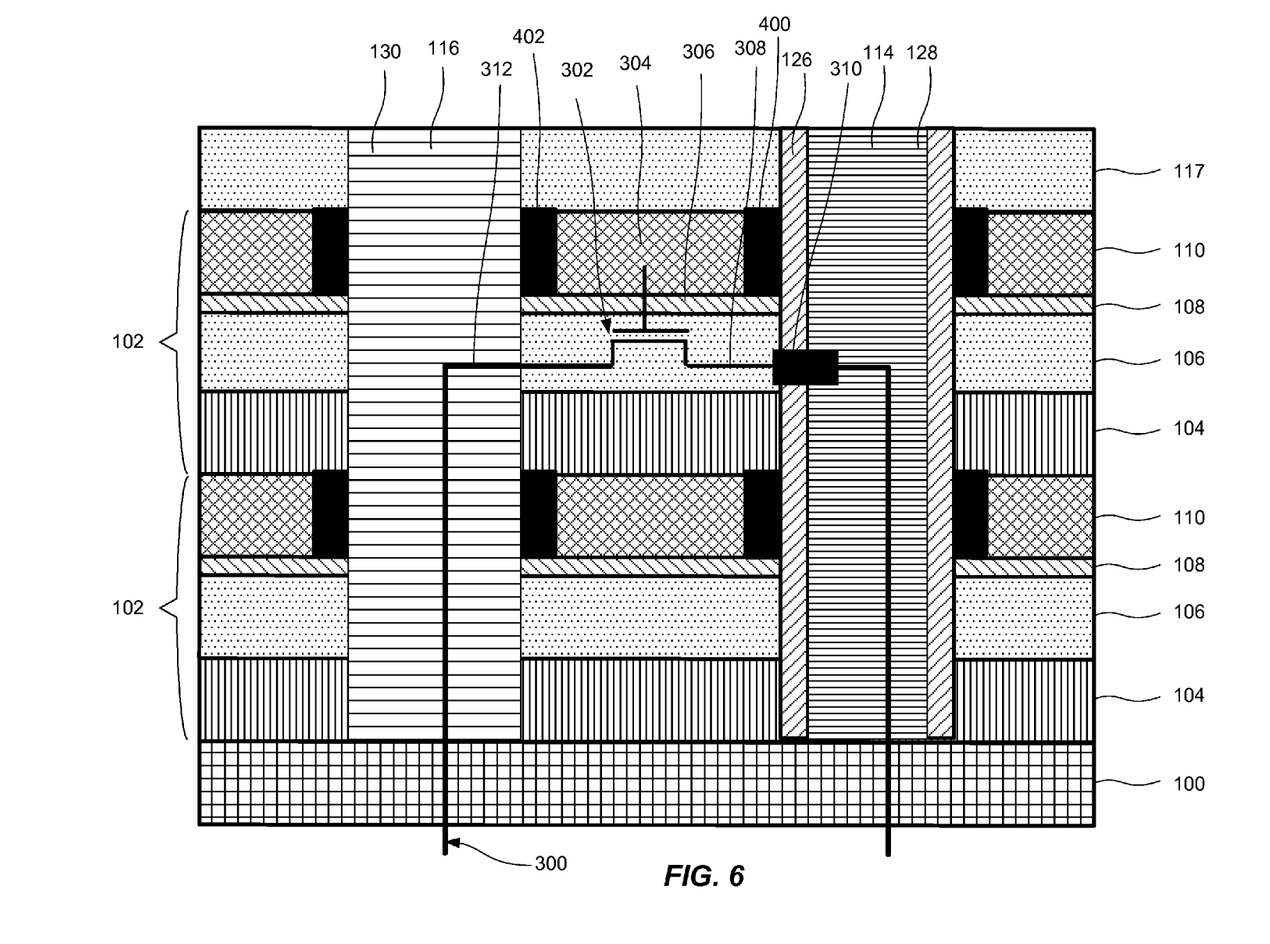
FIG. 6 illustrates a front view of a preliminary stage of a three-dimensional resistive memory array according to an embodiment of the present disclosure.

FIG. 6 illustrates a front view of the preliminary stage of the three-dimensional resistive memory array disclosed in FIGS. 1 to 5. In FIG. 6, it is illustrated that additionally a second type of conductive material 130 has been formed in the trenches of the second type 116. Hence an electrical current may flow between the conducting material of the first type 128 and the second type 130 via a conducting layer 106 of the stack of layers 102. The function of the three-dimensional resistive memory array will further be described below. The forming of the conductive material of the second type 130 corresponds to the step 220 of the method 200.

It should be noted that the second type of conductive material 130 may comprise the same materials as the first type of conductive material 128. To avoid undue repetition, reference is made to the discussion above. The first 128 and the second 130 type of conductive material may be the same as this simplifies the manufacturing of the three-dimensional resistive memory array.

The function of such a three-dimensional resistive memory array will now be described. Again referring to FIG. 6, the function of the three-dimensional resistive memory array is illustrated by a schematic circuit diagram 300.

The integrated circuit 300 comprises a transistor device 302 which may be any of a MOSFET, a pinch-off FET or a FinFET. The transistor device 302 is a three-terminal device. The transistor device 302 may include a channel area extending in a direction substantially perpendicular to a surface of the substrate 100 onto which the stack of layers 102 is provided. A channel area may be formed in the semiconductor layer 106 in a conventional manner.

The conductivity of the electrical path between a resistivity switching memory layer 310 formed by the metal oxide layer 126 and the conductive material of the first type 128 is controlled by the transistor device 302. The transistor device 302 is configured to switch on and/or off the current to the resistivity switching memory layer 310.

In more detail, the transistor device 302 may be formed in the semiconductor layer 106, e.g. a silicon layer, on top of the insulation layer 104. At a top surface of the semiconductor layer 106, the conductive layer 110, acting as a gate electrode 304, is provided. Between the semiconductor layer 106 and the conductive layer 110 the gate insulating layer 108 is sandwiched and acts as a gate dielectric 306. By applying a suitable electrical signal to the gate electrode 304 an inversion or accumulation channel 308 may be formed in the semiconductor layer 106. The inversion or accumulation channel 308 may be used as a switchable electrode between the resistivity switching active layer 310, i.e. the memory cell of the resistive memory array and an electrode 312. By such an operation the resistivity, i.e. a stored value, of the resistivity switching active layer 310 may be changed such that a memory state is changed.

Again referring to FIG. 6, it is illustrated that the conductive layer 110 may in each sequence of the repetitive sequence 102 be provided with a first isolation portion 400 arranged and a second isolation portion 402 arranged adjacent to the conductive layer 110. For clarity only the isolation portions 400, 402 are numbered although the three-dimensional resistive memory array may comprise a plurality of isolation portions of the first and/or second type 400, 402, respectively. The presence of the isolation portion 400, 402 is advantageous as the conductive layer 110 may be electrically isolated from the metal oxide layer 126 in the trenches of the first type 114 and/or the second type of conductive material 130 in the trenches of the second type 116.

FIG. 7 also illustrates the preliminary stage of the three-dimensional resistive memory array disclosed in FIGS. 1 to 6, but now in a top view i.e. a view from a direction being perpendicular to the front surface of the substrate 100.

FIG. 7 further illustrates that subsequent processing steps, corresponding to the steps 222 and 224 in the method 200, have been performed. In the first step a plurality of separated holes 132 extending through the stack of layers 102 has been formed in each trench of the first type 114. The metal oxide layer 126 formed on the inner side walls 120 of the trenches of the first type 114 has thereby been exposed. In each trench of the second type 116 a plurality of separated holes 134 has further been formed. The separated holes 134 also extend through the stack of layers 102. As a result of this processing a three-dimensional structure is obtained. In the so formed three-dimensional structure the holes separate various regions of the stacks of layers 102. The three-dimensional resistive array may thereafter be formed by additionally filling the plurality of separated holes 132, 134 formed in the trenches of the first type 114 and the second type 116 with a second type of dielectric material 136. The step of filling the separated holes corresponds to step 226 of the method 200.

FIG. 8, illustrates the three-dimensional resistive memory array resulting from the above described processing steps. The structure of the obtained three-dimensional resistive memory array may be described by that it comprises an elongated stack of a repetitive sequence 102, each sequence comprising an isolating layer 104, a semiconductor layer 106, a gate insulating layer 108, and a conductive layer 110, the layers being stacked in a perpendicular direction with respect to a longitudinal direction of the elongated stack. The gate insulating layer 108 is arranged between the semiconductor layer 106 and the conductive layer 110. The semiconductor layer 106, the gate insulating layer 108, and the conductive layer 110 form an array of selector transistors arranged along the longitudinal direction of the elongated stack, the elongated stack having a first side surface extending along and to the longitudinal direction of the elongated stack, and a second side surface being opposite to the first side surface. The first side surface of the elongated stack is provided with a metal oxide layer 126. The metal oxide layer 126 is provided with, on a surface facing away from the elongated stack, a second type of dielectric material 136 and a first type of conductive material 128, the second dielectric material 136 and the first type of conductive material 128 alternating along the longitudinal direction of the elongated stack, The second side surface of the elongated stack is provided with the second type of dielectric material 136 and a second type of conductive material 130, the second type of dielectric material 136 and the second type of conductive material 130 alternating along the longitudinal direction of the elongated stack.

Now referring to FIG. 9, according to one embodiment of the present disclosure the method may further comprise the steps of removing the exposed metal oxide 126 formed on the inner side walls 120 of the trenches of the first type 114, such that the semiconductor layer 106 is at least partly exposed 138. The method may also comprise the step of at least partly removing the exposed semiconductor layer 106, 138.

As a result the metal oxide layer 126 may be provided at locations corresponding to the first type of conductive material 128, and the semiconductor layer 106 may be thinner at locations 139. As a result parasitic conduction paths, such as the illustrated parasitic path 140 may be counteracted. By this process, a more efficient direct current path 141 which regulates the function of the resistive memory array may be provided, which improves the performance of the three-dimensional resistive memory device.

It should be noted that that the provided separated holes 132, 134 preferably are filled with a dielectric material of the second type 136.

The person skilled in the art realizes that the present disclosure by no means is limited to the embodiments described above. On the contrary, many modifications and variations are possible within the scope of the appended claims.

For example, the three-dimensional resistive memory array may further comprise an additional elongated stack of a repetitive sequence, wherein the first side surface of the elongated stack and the first side surface of the additional elongated stack are facing each other.

Additionally, variations to the disclosed embodiments can be understood and effected by the skilled person in practicing the claimed disclosure, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Also two or more steps may be performed concurrently or with partial concurrence. Further, the steps of the method may be performed in an order different from what has been disclosed. Such variation will depend on the process hardware systems chosen and on designer choice. All such variations are within the scope of the disclosure. Additionally, even though the disclosure has been described with reference to specific exemplifying embodiments thereof, many different alterations, modifications and the like will become apparent for those skilled in the art.

What is claimed is:

1. A method for manufacturing a three-dimensional resistive memory array, the method comprising the steps of:
    a) providing a substrate;
    b) forming a stack of layers arranged on top of each other on a front surface of the substrate, wherein the stack of layers comprises a repetitive sequence, each sequence comprising an isolating layer, a semiconductor layer, a gate insulating layer, and a conductive layer, wherein the gate insulating layer is arranged between the semiconductor layer and the conductive layer;
    c) forming a plurality of parallel trenches through the stack of layers, the trenches being alternating of a first type and a second type and extending along and to the front surface of the substrate;
    d) removing at least a portion of the conductive layer in each sequence of the stack of layers from inner side walls of the first type and the second type of trenches such that recesses are formed in each sequence of the stack of layers;
    e) filling the trenches of the first type and the second type, and the recesses with a first type of dielectric material;
    f) removing the first type of dielectric material formed in the first type of trenches thereby exposing the side walls of the trenches of the first type thereby leaving the recesses filled;
    g) forming a metal oxide layer on the exposed inner side walls of the trenches of the first type, wherein the metal oxide layer is partly filling the first type of trenches, and wherein the metal oxide layer comprises a binary oxide from a transition metal;
    h) forming a first type of conductive material in a remaining portion of the trenches of the first type;
    i) removing the first type of dielectric material formed in the second type of trenches;
    j) forming a second type of conductive material in the trenches of the second type;
    k) forming in each trench of the first type a plurality of separated holes extending through the stack of layers, and exposing the metal oxide layer formed on the inner side walls of the trenches of the first type;
    l) forming in each trench of the second type a plurality of separated holes extending through the stack of layers; and
    m) filling the plurality of separated holes formed in the trenches of the first type and the second type with a second type of dielectric material.

2. The method according to claim 1, further comprising:
    removing the exposed metal oxide formed on the inner side walls of the trenches of the first type, such that the semiconductor layer is at least partly exposed; and
    at least partly removing the exposed semiconductor layer.

3. The method according to claim 1, wherein the isolating layer comprises an oxide or a nitride, the semiconductor layer comprises Si, Ge or a III-V material, the gate insulating layer comprises SiO2, and the conductive layer comprises TiN, TaN, W or doped or undoped polySi.

4. The method according to claim 1, the method further comprising the step of providing an additional oxide layer on top of the stack of layers.

5. The method according to claim 1, wherein the first and/or second type of dielectric material comprises silicon oxide or silicon nitride.

6. The method according to claim 1, wherein the metal oxide layer comprises any of NiO, HfO, TaO, ZrO, AlO, NbO, TiO.

7. The method according to claim 1, wherein the first and/or second type of conductive material comprises a material selected from the group consisting of semiconductors, metals, conductive oxides, metal nitrides, and metal silicides.

* * * * *